United States Patent
Shumarayev et al.

(10) Patent No.: US 8,537,954 B2
(45) Date of Patent: Sep. 17, 2013

(54) METHOD AND APPARATUS FOR MULTI-MODE CLOCK DATA RECOVERY

(75) Inventors: Sergey Y. Shumarayev, San Leandro, CA (US); Rakesh H. Patel, Cupertino, CA (US); Wilson Wong, San Francisco, CA (US); Tim T. Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 878 days.

(21) Appl. No.: 12/688,617

(22) Filed: Jan. 15, 2010

(65) Prior Publication Data

US 2010/0119024 A1    May 13, 2010

Related U.S. Application Data

(63) Continuation of application No. 11/040,342, filed on Jan. 21, 2005, now Pat. No. 7,680,232.

(51) Int. Cl.
  *H03D 3/24*    (2006.01)

(52) U.S. Cl.
  USPC .......................... 375/376; 375/371

(58) Field of Classification Search
  USPC .................................... 375/376, 371
  See application file for complete search history.

(56) References Cited

U.S. PATENT DOCUMENTS

| | | |
|---|---|---|
| 3,831,195 A | 8/1974 | Davis et al. |
| 4,502,143 A | 2/1985 | Kato et al. |
| 4,584,695 A | 4/1986 | Wong et al. |
| 5,059,924 A | 10/1991 | JenningsCheck |
| 5,355,090 A | 10/1994 | Pajowski et al. |
| 5,668,830 A | 9/1997 | Georgiou et al. |
| 5,714,904 A | 2/1998 | Jeong |
| 5,986,990 A | 11/1999 | Moon |
| 6,100,735 A | 8/2000 | Lu |
| 6,125,157 A | 9/2000 | Donnelly et al. |
| 6,259,755 B1 | 7/2001 | O'Sullivan et al. |
| 6,266,799 B1 | 7/2001 | Lee et al. |
| 6,282,204 B1 | 8/2001 | Balatoni et al. |
| 6,292,116 B1 | 9/2001 | Wang et al. |
| 6,396,788 B1 | 5/2002 | Feyh et al. |
| 6,452,591 B1 | 9/2002 | Ho et al. |
| 6,525,615 B1 | 2/2003 | Masenas et al. |
| 6,650,140 B2 | 11/2003 | Lee et al. |
| 6,693,985 B2 | 2/2004 | Li et al. |
| 6,750,675 B2 | 6/2004 | Venkata et al. |
| 6,807,225 B1 | 10/2004 | Tonietto et al. |

(Continued)

FOREIGN PATENT DOCUMENTS

EP    1 113616    7/2001

OTHER PUBLICATIONS

U.S. Appl. No. 10/923,129, filed Aug. 20, 2004, Venkata.

*Primary Examiner* — Khanh C Tran
*Assistant Examiner* — Nader Bolourchi
(74) *Attorney, Agent, or Firm* — Ropes & Gray LLP (57) ABSTRACT

The disclosed invention is a technology for producing a recovered clock signal using a multi-mode clock data recovery (CDR) circuit that accommodates a flexible range operating frequencies F and consecutive identical digit requirements CID. In a first mode of operation, a controlled oscillator produces the recovered clock signal, and in a second mode of operation, a phase interpolator produces the recovered clock signal. The multi-mode CDR circuit operates in the first mode if (CID/F) is less than a threshold time value and in the second mode if (CID/F) is greater than the threshold time value.

19 Claims, 7 Drawing Sheets

(56) References Cited

U.S. PATENT DOCUMENTS

| | | |
|---|---|---|
| 6,854,044 B1 | 2/2005 | Venkata et al. |
| 6,900,676 B1 | 5/2005 | Tamura |
| 6,934,301 B2 | 8/2005 | Jordan |
| 7,089,444 B1 | 8/2006 | Asaduzzaman et al. |
| 7,091,890 B1 | 8/2006 | Sasaki et al. |
| 7,135,901 B2 * | 11/2006 | Tsai ............................ 327/156 |
| 7,138,837 B2 | 11/2006 | Venkata et al. |
| 7,180,972 B1 | 2/2007 | Venkata et al. |
| 7,190,754 B1 | 3/2007 | Chang et al. |
| 7,242,221 B1 | 7/2007 | Hoang et al. |
| 7,305,058 B1 | 12/2007 | Venkata et al. |
| 7,366,267 B1 | 4/2008 | Lee et al. |
| 7,397,788 B2 | 7/2008 | Mies et al. |
| 7,543,209 B2 | 6/2009 | Bonneau et al. |
| 7,680,232 B2 | 3/2010 | Shumarayev et al. |
| 2001/0033188 A1 | 10/2001 | Aung et al. |
| 2002/0049917 A1 | 4/2002 | Portman et al. |
| 2002/0141515 A1 | 10/2002 | Enam et al. |
| 2002/0186804 A1 | 12/2002 | Dorschky et al. |
| 2002/0190751 A1 | 12/2002 | Lee et al. |
| 2003/0006808 A1 | 1/2003 | Weng et al. |
| 2003/0012322 A1 | 1/2003 | Partsch et al. |
| 2003/0052709 A1 | 3/2003 | Venkata et al. |
| 2003/0086517 A1 | 5/2003 | Vallet et al. |
| 2003/0210758 A1 | 11/2003 | Lee et al. |
| 2003/0212930 A1 | 11/2003 | Aung et al. |
| 2003/0217214 A1 | 11/2003 | Calvignac et al. |
| 2003/0218486 A1 | 11/2003 | Kwak |
| 2004/0085974 A1 | 5/2004 | Mies et al. |
| 2004/0095863 A1 | 5/2004 | Verboom et al. |
| 2004/0114632 A1 | 6/2004 | Yuuki et al. |
| 2004/0140837 A1 | 7/2004 | Venkata et al. |
| 2004/0141567 A1 | 7/2004 | Yang et al. |
| 2004/0252804 A1 | 12/2004 | Aoyama |
| 2005/0036579 A1 | 2/2005 | Shiraishi |
| 2005/0180536 A1 | 8/2005 | Payne et al. |
| 2006/0029176 A1 | 2/2006 | Ge et al. |
| 2006/0165204 A1 | 7/2006 | Shumarayev et al. |

* cited by examiner

METHOD AND APPARATUS FOR MULTI-MODE CLOCK DATA RECOVERY

This application is a continuation of U.S. patent application Ser. No. 11/040,342, filed Jan. 21, 2005, which is hereby incorporated by reference herein in its entirety.

BACKGROUND OF THE INVENTION

This invention relates to clock data recovery (CDR) technology, and more particularly to CDR circuitry that accommodates a wider range of frequency and run-length requirements.

An increasingly important type of signaling between devices is signaling in which the clock signal information is embedded in a serial data stream so that no separate clock signal needs to be transmitted. The clock signal is "recovered" at the receiver and used in processing the data stream. This general type of signaling is commonly referred to as "clock data recovery" or "CDR" signaling. U.S. patent application Ser. No. 09/805,843, filed on Mar. 13, 2001, and Ser. No. 10/454,731, filed on Jun. 3, 2003, describe various aspects of CDR signaling and are hereby incorporated herein by reference in their entirety.

In one type of CDR signaling, the frequency of the clock signal is known by the receiver, and the phase information for the clock signal is recovered from the data signal by the high-to-low and/or low-to-high transitions in the data signal. An oscillator at the receiver provides a clock signal having the known frequency, and phase information embedded in the data signal is used to adjust the phase of the receiver clock signal.

Clock data recovery can be accomplished in many ways to meet the demands of particular applications. However, a CDR implementation for one application may not meet the demands of another application having different criteria. The trend in technology is towards the convergence of many different applications into a single device, and it would be desirable to employ CDR circuitry that can accommodate those many different applications. Furthermore, the fast pace of improvements in technology for the same application demands that CDR circuitry be robust enough to operate in modern applications and yet be flexible enough to accommodate future improvements as well. Accordingly, there is continued interest in improving CDR technology.

SUMMARY OF THE INVENTION

The disclosed invention is a technology for producing a recovered clock signal using a multi-mode clock data recovery circuit that accommodates a flexible range of operating requirements. In particular, the disclosed technology accommodates a flexible range of operating frequencies and consecutive identical digit (CID) requirements.

In accordance with the disclosed technology, a multi-mode clock data recovery (CDR) circuit produces a recovered clock signal using one of two or more modes of operation. A multi-mode CDR circuit includes a controlled oscillator and a phase interpolator that each can provide a recovered clock signal. In a first mode, the controlled oscillator provides the recovered clock signal, and in a second mode, the phase interpolator provides the recovered clock signal.

The multi-mode CDR includes a phase detector that compares the phase of a recovered clock signal to the phase of a data signal and issues phase adjustment signals according to that comparison. In the first mode, the phase adjustment signals are conveyed to the controlled oscillator, which adjusts the phase of the recovered clock signal according to the phase adjustment signals. In the second mode, the phase adjustment signals are conveyed to the phase interpolator, which adjusts the phase of the recovered clock signals according to the phase adjustment signals.

The controlled oscillator can include multiple output connections and can provide a candidate recovered clock signal on each of the output connections. The phase interpolator can be coupled to the multiple output connections. In the first mode, one of the candidate recovered clock signals is taken to be the recovered clock signal, and in the second mode, the phase interpolator processes the multiple candidate recovered clock signals to produce a recovered clock signal.

The multi-mode CDR circuit includes a frequency detector that compares the frequency of the recovered clock signal to the frequency of a reference clock signal and issues frequency adjustment signals according to that comparison. The multi-mode CDR circuit can include a switch that can be coupled to the frequency detector or to the phase detector, or can be set to a non-coupling position.

In the first mode of operation, the switch can be selectively operated between the different positions as follows. In one implementation, if a data signal is being received, the switch can be coupled to the phase detector to convey phase adjustment signals to the controlled oscillator. In one implementation, if the frequency of the recovered clock signal differs from the frequency of the reference clock signal by more than a tolerance point, the switch can be coupled to the frequency detector to convey frequency adjustment signals to the controlled oscillator until the frequency of the recovered clock signal differs from the frequency of the reference clock signal by at most an acceptable frequency difference. In one implementation, even if a data signal is being received, the switch is operated to couple to the frequency detector if the frequency of the recovered clock signal requires adjustment. In one implementation, if no data signal is being received and the frequency of the recovered clock signal does not require adjustment, the switch can be operated to be in the non-coupling position.

In the second mode of operation, the switch is operated to couple to the frequency detector and the frequency adjustment signals.

In one embodiment, the multi-mode CDR circuit can accommodate an application having a transmission frequency F and a consecutive identical digits requirement CID according to a tolerance time value. The multi-mode CDR circuit can operate in the first mode if (CID/F) is less than the tolerance time value and in the second mode if (CID/F) is greater than the tolerance time value.

DETAILED DESCRIPTION

The disclosed technology is an invention for a multi-mode clock data recovery (CDR) architecture that can accommodate a flexible range of clock frequencies and other parameters. Of particular interest is a commonly used parameter called consecutive identical digits (CID). Various applications that employ CDR provide a CID requirement that specifies the number of consecutive "zero" bits or "one" bits the CDR circuit can expect to encounter in the data signal. As will be further described herein, the disclosed multi-mode CDR architecture accommodates a flexible range of CID requirements. The following detailed description will make reference to U.S. patent application Ser. No. 09/805,843 for "Clock Data Recovery Circuitry associated with Programmable Logic Device Circuitry," which for convenience will be referred to herein as the "Aung reference."

Figure 1:
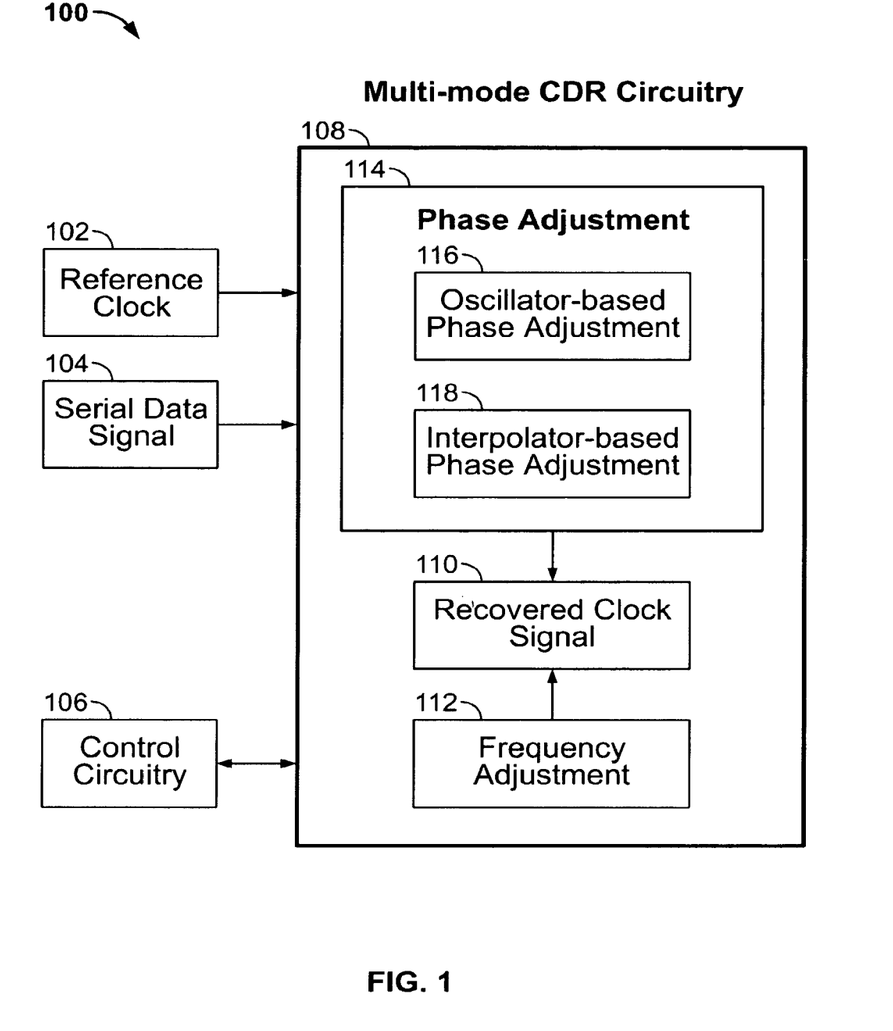
FIG. 1 is a block diagram of an exemplary multi-mode clock data recovery architecture in accordance with the invention.

Referring now to FIG. 1, there is shown a multi-mode CDR architecture 100 in accordance with the invention. The CDR architecture receives a reference clock signal 102 and a serial data signal 104, which are described in the Aung reference. Control circuitry 106 observes the reference clock signal and the serial data signal and operates the multi-mode CDR circuitry 108 in accordance with the observations. The multi-mode CDR circuitry 108 includes a recovered clock signal 110 that depends on adjustment signals (not shown) issued by a frequency adjustment component 112 and a phase adjustment component 114. The frequency adjustment component 112 issues adjustment signals that cause the frequency of the recovered clock signal 110 to converge to the frequency of the reference clock signal 102. The phase adjustment component 114 in turn issues adjustment signals that cause the phase of the recovered clock signal 110 to converge to the phase of the serial data signal 104. As shown in FIG. 1, the phase adjustment component 114 includes an oscillator-based sub-component 116 and an interpolator-based sub-component 118. The determination of which sub-component to use for a particular application/situation can be determined, in part, by the control circuitry 106.

Although the reference clock 102 and control circuitry 106 are illustrated as being external to the CDR circuitry 108, they can be implemented within the CDR circuitry as a design choice. The reference clock signal can originate from a programmable clock source and/or from one of several clock sources. As described in the Aung reference, the frequency of the reference clock signal has a known relationship to the transmission frequency of the serial data signal, but the two signals generally do not have a known phase relationship.

Figure 2:
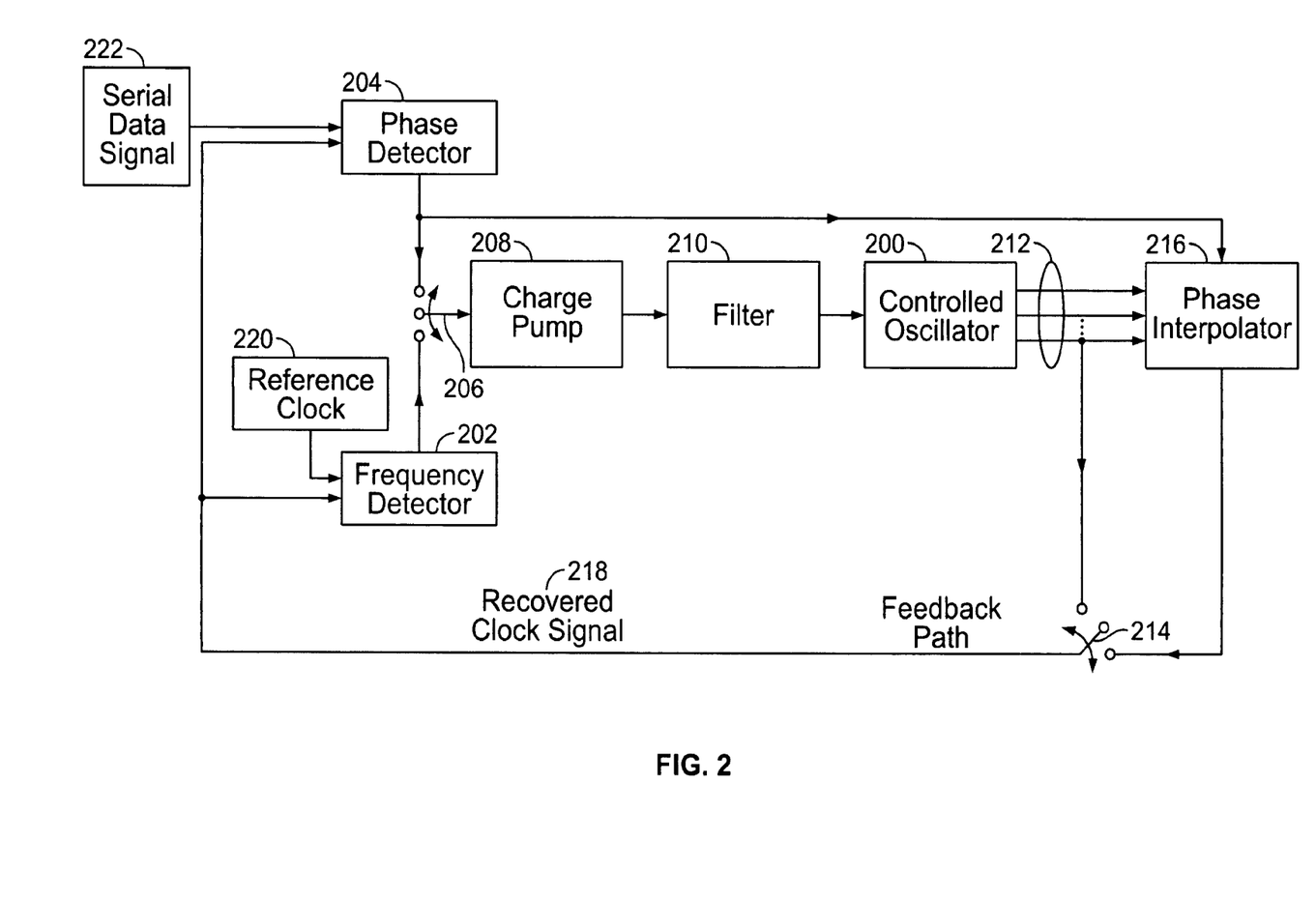
FIG. 2 is a block diagram of exemplary components of the multi-mode CDR circuitry of FIG. 1.

Referring now to FIG. 2, there is shown an exemplary embodiment of the multi-mode CDR circuitry of FIG. 1. The controlled oscillator 200 is responsible for producing a clock signal and receives adjustment signals from a frequency detector 202 and/or a phase detector 204. Although various types of controlled oscillators may be employed, it will be assumed without loss of generality that the controlled oscillator is a voltage-controlled oscillator ("VCO").

In the illustrated embodiment, the frequency detector 202 and phase detector 204 are selectively coupled by a switch 206 to a charge pump 208 and a filter 210. The switch 206 can be implemented by one or more electrical switches (e.g., transistors), multiplexors, or other circuitry that performs a selective coupling operation. Furthermore, although the illustration shows a single switch that is external to the various components, the switch can be implemented using several switches that are each integrated into the various components. Control circuitry (FIG. 1, 106), which will be further described herein, controls the operation of the charge pump switch 206.

The frequency detector 202 compares a recovered clock frequency to a reference clock frequency and issues adjustment signals that cause the recovered clock frequency to converge to the reference clock frequency. The frequency detector 202 can be a phase-frequency detector, an XOR detector, or another detector that issues frequency adjustment signals. The phase detector 204 compares the recovered clock phase to the phase of the data signal 222 and issues adjustment signals that cause the recovered clock phase to converge to the data signal phase. The phase detector 204 can be a Hogge phase detector, a Bang-Bang phase detector, or another detector that issues phase adjustment signals.

Adjustment signals that are issued from the frequency detector 202 or phase detector 204 are generally in the form of voltage pulses. The charge pump switch 206 couples these voltage pulses to the charge pump 208 which converts them into current pulses. The current pulses are then coupled to the filter 210. In a general implementation, the filter 210 includes one or more capacitor elements that are charged or discharged by the current pulses and thereby convert the current pulses into a filtered voltage. Other non-capacitive elements in the filter 210 can also affect the properties of the filtered voltage. This filtered voltage is the input voltage to the VCO 200.

A VCO operates by converting an input voltage into a clock signal whose frequency is determined by the magnitude of the input voltage. The relationship between changes in input voltage and resulting changes in the clock frequency is generally referred to as the "sensitivity" of a VCO. As an example, a VCO's sensitivity may be 50 MHz/Volt. A VCO adjusts the frequency of the recovered clock signal by speeding up or slowing down the oscillations in its clock signal. In doing so, the phase of the recovered clock signal becomes predictably affected as well. Thus, a VCO can also be used to make adjustments to the phase of the recovered clock signal.

As FIG. 2 shows, the VCO 200 provides a plurality of clock signals on a plurality of output connections 212. The clock signals 212 each have the same frequency but different phases. For example, the VCO 200 can produce four clock signals that are each a quarter-cycle out of phase. In one mode of operation, the clock signal from one of these outputs can be fed back to the frequency detector 202 and the phase detector 204 by being coupled through a feedback switch 214. The clock signal that is coupled can be the one that has the earliest phase, for example. In another mode of operation, the feedback switch 214 can couple the output of a phase interpolator 216 to the feedback path. The phase interpolator 216 uses the plurality of VCO clock signals 212 to produce its output clock signal. The clock signal that is coupled to the feedback path is the recovered clock signal 218.

The phase interpolator 216 is controlled by adjustment signals issued by the phase detector 204. The phase interpolator 216 can be an analog interpolator that performs phase mixing, a digital interpolator that performs phase selection, or another phase interpolator that can adjust the recovered clock phase to converge toward the data signal phase. The Aung reference provides a description of analog and digital phase interpolators, and particular examples of a digital phase interpolator are described in U.S. patent application Ser. No. 10/349,541, filed on Jan. 21, 2003, and Ser. No. 10/923,129, filed on Aug. 20, 2004, which are hereby incorporated herein by reference.

The CDR circuitry can optionally include a frequency divider component (not shown), which is generally used for cases in which the controlled oscillator 200 operates at a higher frequency range than the reference clock 220. In one implementation, such a frequency divider component can be located immediately after the controlled oscillator 200. For the purpose of clarity, a frequency divider component is not shown in FIG. 2.

The components and connections illustrated in FIG. 2 and their configuration and placement are exemplary, and other embodiments are also contemplated. For example, the charge pump coupling operation and the feedback coupling operation may be implemented by a different number of switches and/or by differently positioned switches. Importantly, a greater or lesser number of switches and/or components can be used as long as the multi-mode CDR circuitry operates in accordance with the scheme shown in FIG. 3, which will now be described.

Figure 3:
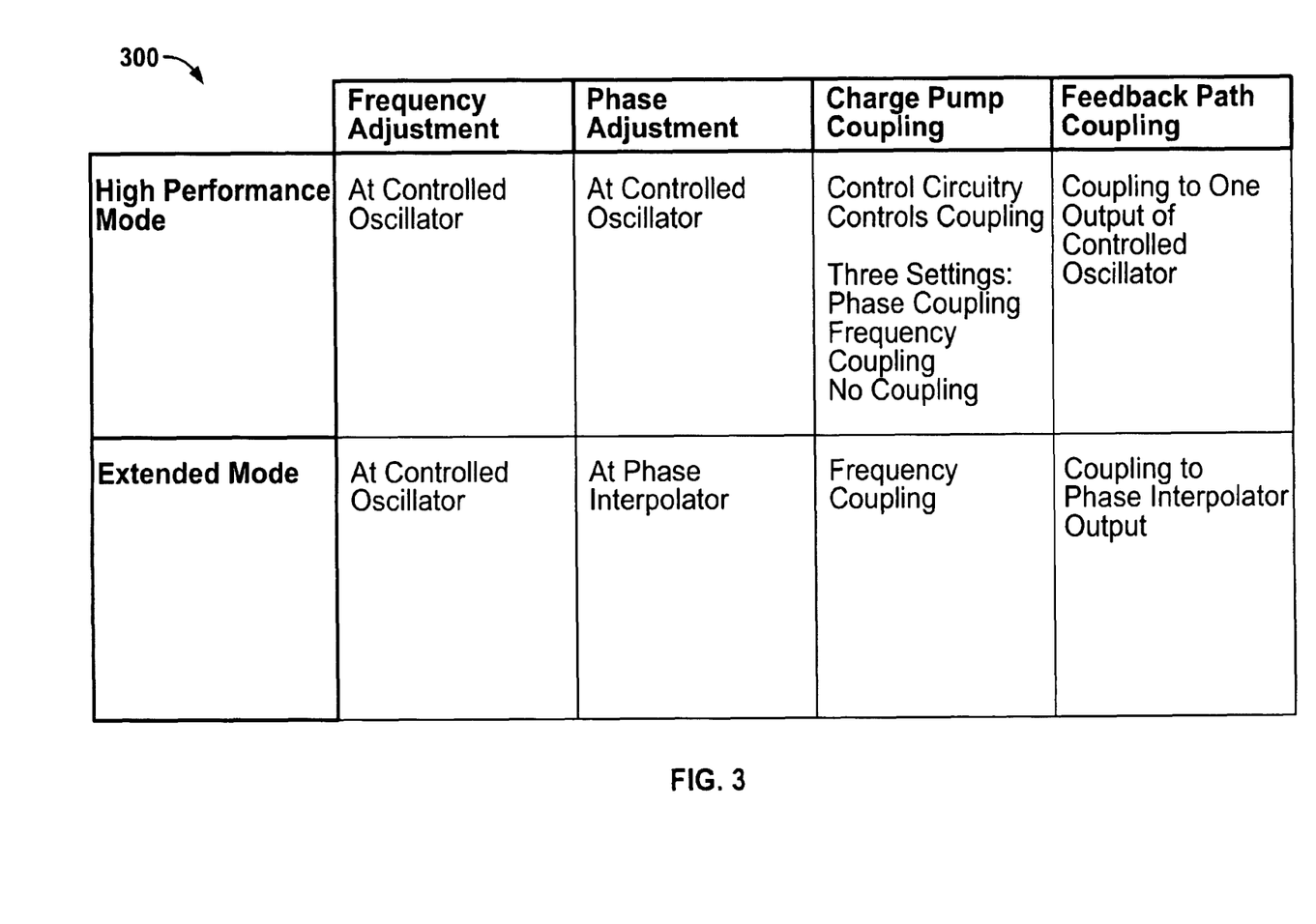
FIG. 3 is a table summarizing two modes of operation for the multi-mode CDR circuitry of FIG. 2.

FIG. 3 shows a table 300 that summarizes two modes of operation for a multi-mode CDR architecture in accordance with the disclosed invention. In a first mode, referred to herein as the high performance mode, both frequency adjustment and phase adjustment of the recovered clock signal occur separately at the VCO. Because the VCO is an analog device, adjustments that are made to the recovered clock signal are not limited in precision and also occur more quickly, as compared to a digital implementation. In high performance mode, the feedback path is always coupled to one connection of the VCO output, and this connection provides the recovered clock signal. The charge pump switch, on the other hand, selectively couples to the frequency detector or the phase detector or neither, and its operation is controlled by the control circuitry.

Figure 4:
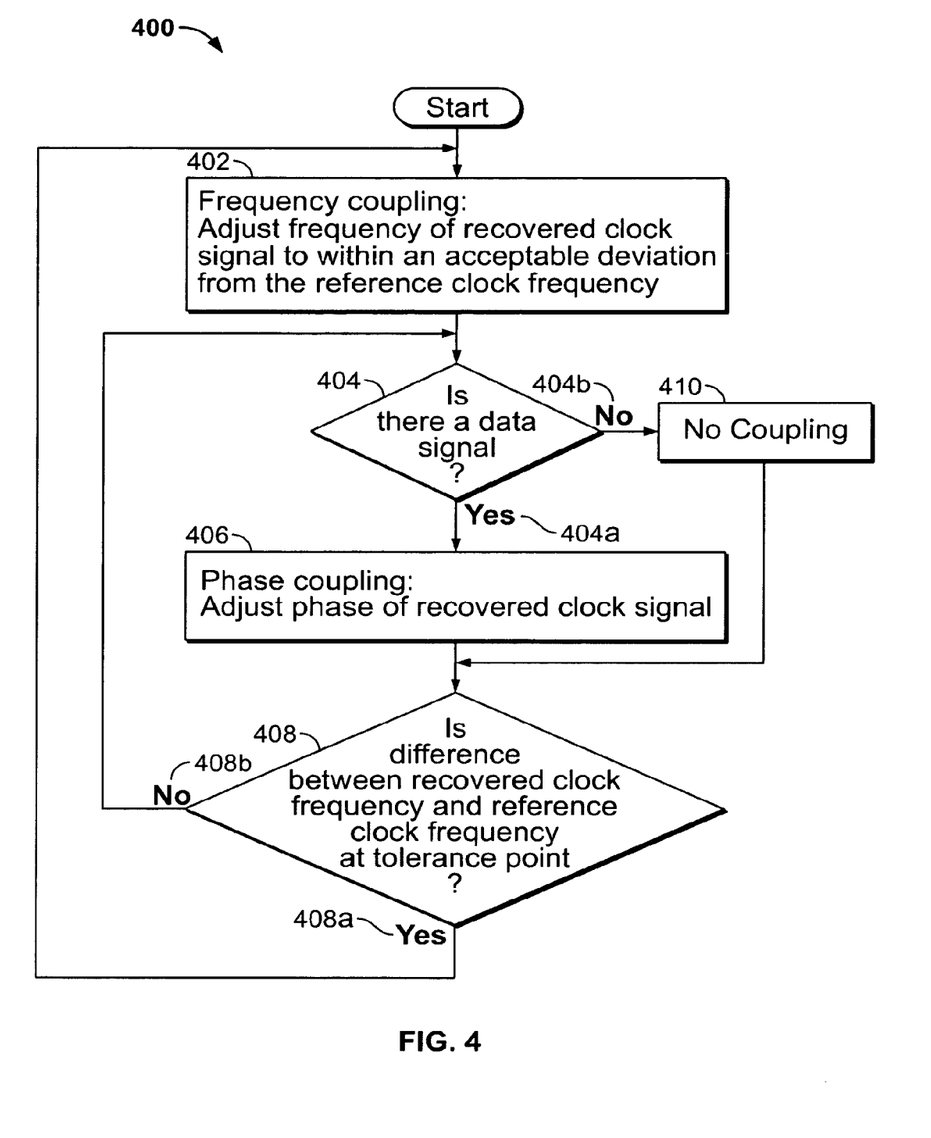
FIG. 4 is a flow diagram of exemplary control circuitry operations for charge pump coupling.

FIG. 4 is a flow chart 400 showing the high performance mode operation of the charge pump switch by the control circuitry. For convenience herein, when the charge pump switch couples to the frequency detector, such coupling will be referred to as "frequency coupling," and when the charge pump switch couples to the phase detector, such coupling will be referred to as "phase coupling." Optionally, the charge pump switch can maintain a non-coupling position in which the charge pump does not couple to either detector and therefore receives no adjustment signals.

Referring to FIG. 4, initially during startup, frequency coupling occurs to enable the recovered clock frequency to converge towards the reference clock frequency 402. In the illustrated embodiment, the recovered clock frequency only needs to converge to within an acceptable deviation from the reference clock frequency. When this has been accomplished, the control circuitry then determines whether there is a data signal to receive on an incoming connection 404. One way to make this determination is to measure the energy level of signals on the incoming connection. The control circuitry can determine that if the energy level is greater than some threshold level, there is an incoming data signal to receive 404a. In that case, the control circuitry can enable phase coupling so that the phase of the recovered clock signal can converge toward the phase of the incoming data signal 406.

During phase coupling, the control circuitry continues to monitor any difference between the recovered clock frequency and the reference clock frequency 408. If this frequency difference reaches a particular tolerance point 408a, the control circuitry can suspend phase coupling and switch to frequency coupling to adjust the frequency of the recovered clock signal 402. When the recovered clock frequency again converges to within an acceptable deviation from the reference clock frequency, the control circuitry can return to phase coupling. In the case in which the control circuitry determines that frequency adjustment is not needed 408b and there is no data signal on the incoming connection 404b, the control circuitry can optionally maintain the charge pump switch at a non-coupling position so that there is no coupling 410.

As previously mentioned, the control circuitry can monitor any difference between the recovered clock frequency and the reference clock frequency. This difference can occur because current and/or voltage leakage from various circuit components can cause the VCO to undesirably vary its output.

Figure 5:
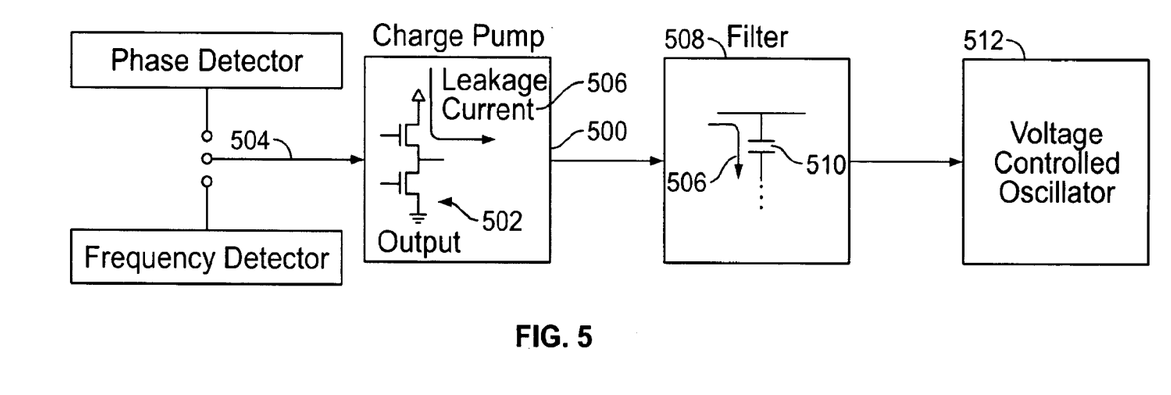
FIG. 5 is a diagram showing high-impedance output leakage in the charge pump component of FIG. 2.

Illustrated in FIG. 5 are exemplary elements of the charge pump and filter components of FIG. 2. In one implementation, the charge pump 500 includes an output stage 502 that can be set to a high-impedance state, i.e., "tristated", when, for example, the charge pump switch 504 is in the non-coupling position. In operation, even when the charge pump output 502 is tristated, a non-zero "leakage" current 506 may flow out of the charge pump 500 and into the filter 508. This leakage current 506 can charge a capacitor element 510 in the filter and cause voltage variations at the input to the VCO 512. This voltage variation can be described by the familiar capacitor equation:

$$i = \frac{\Delta Q}{\Delta t} = C\frac{\Delta V}{\Delta t},$$

where i is the current flow into or out of the capacitor, and $\Delta V$ is the change in voltage across the capacitor. Even though $\Delta V$ may be extremely small, a change in capacitor voltage can undesirably cause the VCO 512 to vary its output frequency and/or phase. As an example, suppose the sensitivity of the VCO is fifty MHz/Volt. A one nA ($10^{-9}$ ampere) current flowing into or out of a one nF ($10^{-9}$ farad) capacitor would cause the voltage to vary at a rate of one millivolt per millisecond. This voltage variation corresponds to a change of fifty KHz in the VCO output frequency and a variation in phase.

Figure 6:
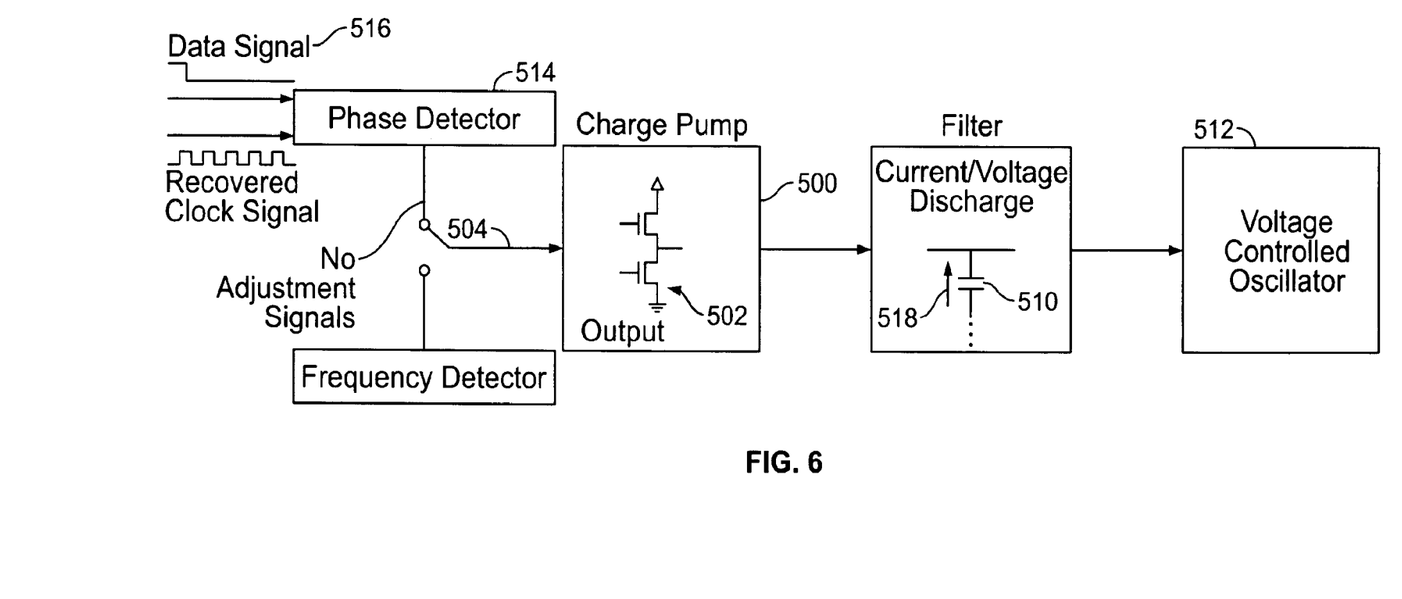
FIG. 6 is a diagram showing capacitor discharge in the filter component of FIG. 2.

In another situation shown in FIG. 6, the charge pump output 502 may not be tristated but also may not be receiving any frequency or phase adjustment signals. This situation can arise during phase coupling when the phase detector 514 is unable to issue adjustment signals because of an absence of zero-to-one or one-to-zero transitions in the data signal 516. In this situation, the filter capacitor 510 does not receive any current pulses from the charge pump 500 and can begin to discharge current/voltage 518, causing the VCO 512 to undesirably vary its output frequency and/or phase. For convenience, this capacitor discharge 518 will also be referred to herein as "leakage."

In high performance mode, leakage can place limitations on the data signal transmission frequency and/or the consecutive identical digit (CID) requirements of an application. The limitations can be summarized as follows. Suppose, as before, the recovered clock frequency is allowed to differ from the reference clock frequency by up to a particular tolerance point, and the amount of time for the recovered clock frequency to vary from an acceptable frequency to that tolerance point due to leakage is $T_{tol}$. If the transmission frequency of an application is $F_{app}$ and the consecutive identical digits requirement is $CID_{app}$, then a transmission cycle is $(1/F_{app})$ seconds, and the amount of time covered by $CID_{app}$ transmission cycles is $(CID_{app}*(1/F_{app}))$. Generally, this amount of time should not exceed $T_{tol}$ or else the recovered clock signal may become unsuitable for processing the data signal. Thus, $F_{app}$ and $CID_{app}$ should be restricted so that $$(CID_{app}*(1/F_{app})) \leq T_{tol}. \tag{EQ1}$$

This means that if an application operates at a particular transmission frequency $F_{app}$, then the number of consecutive identical digits cannot exceed $(T_{tol}*F_{app})$, that is:

$$CID_{app} \leq (T_{tol}*F_{app}).$$

On the other hand, if an application specifies a particular CID requirement $CID_{app}$, then the transmission frequency cannot be lower than $(CID_{app}/F_{app})$ that is:

$$F_{app} \geq (CID_{app}/T_{tol}).$$

In accordance with the disclosed invention, if the condition of EQ1 cannot be satisfied in high performance mode, the multi-mode CDR architecture uses a second mode that is referred to herein as extended mode. Referring to the table of FIG. 3, in extended mode, frequency adjustment of the recovered clock signal occurs at the VCO and phase adjustment occurs at the phase interpolator. In extended mode, the charge pump is always coupled to the frequency detector and the feedback path is always coupled to the phase interpolator output connection. As discussed below, configuring the CDR circuitry to operate in extended mode mitigates the leakage problem.

Figure 7:
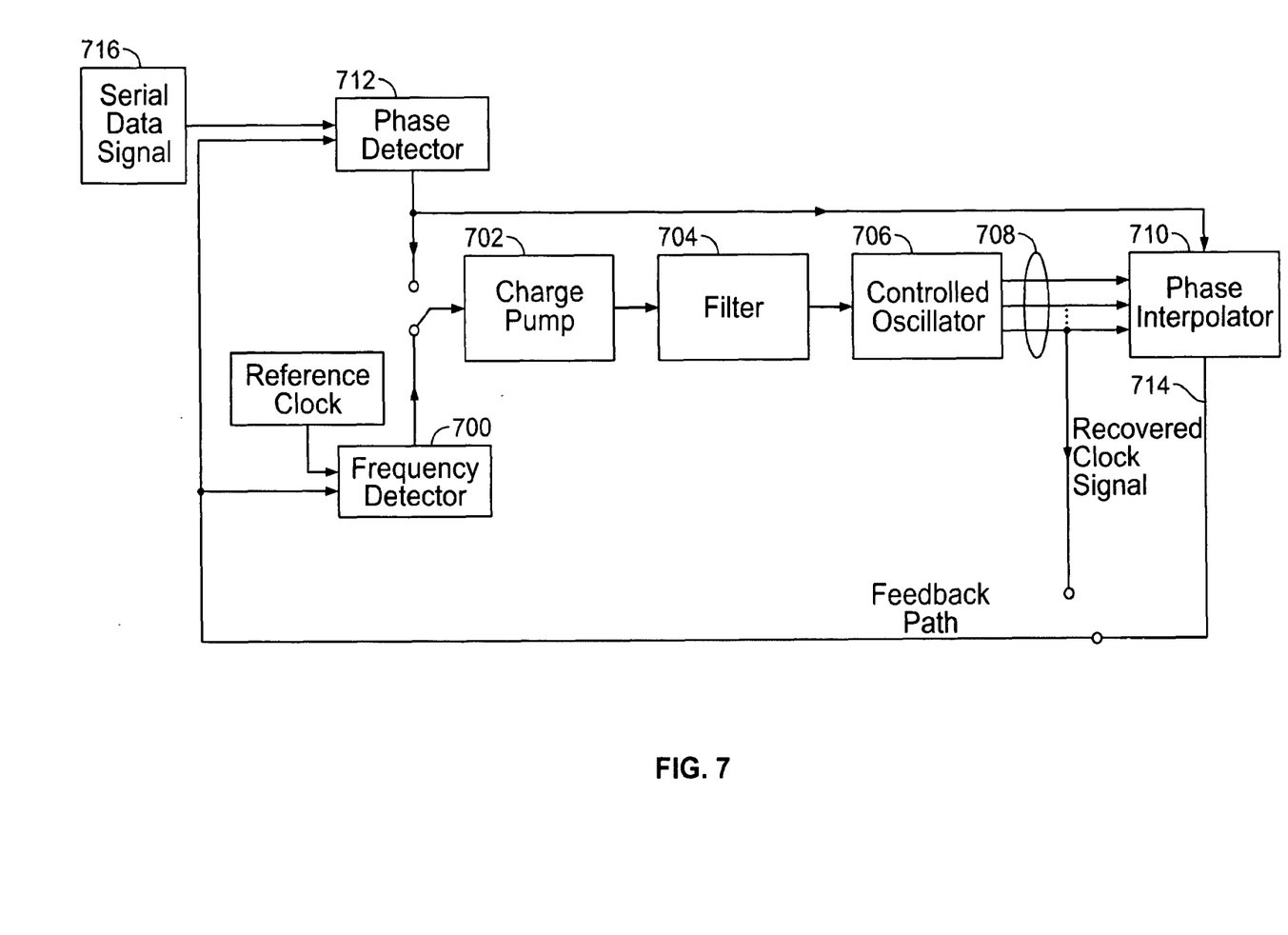
FIG. 7 is a diagram of the CDR circuitry of FIG. 2 configured to operate in extended mode.

Shown in FIG. 7 is a diagram of the CDR components of FIG. 2 configured to operate in extended mode. The frequency detector 700 is coupled to the charge pump 702 and continuously issues frequency adjustment signals. Because these signals are issued continuously, the filter 704 does not have a chance to discharge to the same degree as in high performance mode. More importantly, the frequency of the recovered clock signal is continuously maintained at the VCO 706 and will not reach the tolerance point. In general, the VCO 706 can provide a number N of recovered clock signals 708, which in extended mode will be referred to as "candidate clock signals." The N candidate clock signals appear on N output connections 708 so that neighboring output connections contain shifted clock signals that are (1/N)-cycle out of phase. For example, if N=4 so that there are four output connections, then any two neighboring output connections will contain shifted clock signals that are (¼)-cycle (i.e., one quarter-cycle) out of phase.

The phase interpolator 710 is controlled by the phase detector 712 to process the N candidate clock signals 708 and produce a single recovered clock signal 714. The phase interpolator 710 can operate in one of at least two ways. In the first way, the phase interpolator 710 can "mix" two or more of the N candidate clock signals 708 to produce a resulting, combined signal, i.e., the recovered clock signal 714. The particular signals to mix and the proportions of each signal to use in the combination can be controlled by the phase adjustment signals issued by the phase detector 712. Because of the mixing, the phase of the combined signal can be "finer" than the phases of the candidate clock signals in that it can better match the phase of the data signal 716. In a digital phase interpolator, the phase of the combined signal may be quantized so that the degree of precision is limited. Ideally, the combined signal will maintain the same signal shape as the candidate clock signals. In an analog phase interpolator, analog mixing will ideally allow the phase of the combined signal to be infinitely precise. However, the shape of the combined signal may be distorted from the shape of the candidate signals.

In the second way, the phase interpolator 710 can select one of the candidate clock signals 708 that most closely matches the data signal 716 in phase. This selection can be controlled by the adjustment signals issued by the phase detector 712. Given N candidate clock signals, the greatest possible phase difference between a selected candidate signal and the data signal is (1/(2N))-cycle. For example, if there are four candidate clock signals, the greatest possible phase different between the selected candidate signal and the data signal is (⅛)-cycle. Because the recovered clock signal 714 is a selected one of the candidate clock signals 708, the recovered clock signal should maintain the same signal shape as the candidate clock signals. However, the recovered clock signal has no improvement in phase matching over the candidate clock signals.

In extended mode, therefore, the frequency detector 700 continuously adjusts the frequency of the recovered clock signal at the VCO 706 and the phase detector 712 continuously adjusts the phase of the recovered clock signal at the phase interpolator 710. During a CID run in the data signal 716, filter leakage is no longer a concern because the filter 704 continues to receive frequency adjustment signals. Furthermore, the phase interpolator 710 is not adversely affected by any absence of phase adjustment signals.

Figure 8:
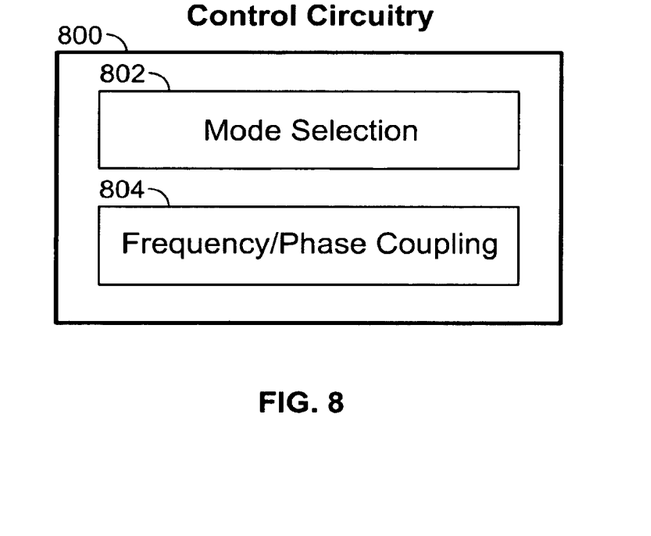
FIG. 8 is a diagram of exemplary components in the control circuitry of FIG. 1.

Referring now to FIG. 8, there is shown a block diagram of the control circuitry of FIG. 1. The control circuitry 800 contains a mode selection block 802 and a frequency/phase coupling block 804. The mode selection block 802 configures the multi-mode CDR circuitry to operate in high performance mode or in extended mode. The mode selection block can by itself electronically determine which mode is suitable, or it can receive a signal from a person or another device instructing it to operate in a particular mode. The frequency/phase coupling block 804 controls the charge pump coupling when the CDR circuitry is operating in high performance mode, in accordance with the flow chart of FIG. 4.

Accordingly, what has been describe thus far is a multi-mode CDR architecture that can accommodate a flexible range of transmission frequencies and CID requirements. One skilled in the art will appreciate that any embodiment described and/or illustrated herein is exemplary and does not limit the scope of the invention as defined by the following claims.

What is claimed is:

1. A clock data recovery circuit, comprising:
 a first switch that selectively conveys an output of a controlled oscillator as a recovered clock signal to a frequency detector and a phase detector; and
 a second switch that selectively couples an output of the frequency detector to the controlled oscillator
 based on a comparison of a difference between a frequency of the recovered clock signal and a frequency of a reference clock signal with a tolerance point, at least until the frequency of the recovered clock signal differs from the frequency of the reference clock signal by at most an acceptable difference.

2. The clock data recovery circuit of claim 1, wherein said controlled oscillator comprises a plurality of oscillator output connections, where said controlled oscillator provides a candidate recovered clock signal on each of said plurality of oscillator output connections, each candidate recovered clock signal being offset in phase from every other candidate recovered clock signal.

3. The clock data recovery circuit of claim 2, wherein the first switch is coupled to the controlled oscillator by being connected to one of said plurality of oscillator output connections.

4. The clock data recovery circuit of claim 1, further comprising:
 a connection for providing a data signal,
 wherein the phase detector is coupled to said first switch and said connection, and has a phase detector output connection, where said phase detector issues phase adjustment signals on said phase detector output connection.

5. The clock data recovery circuit of claim 4, wherein said phase adjustment signals are conveyed to the controlled oscillator, said controlled oscillator adjusting the phase of the recovered clock signal according to the phase adjustment signals.

6. The clock data recovery circuit of claim 5, wherein said phase adjustment signals are conveyed to the controlled oscillator through a charge pump and a filter.

7. The clock data recovery circuit of claim 1, wherein the first switch alternatively conveys an output of a phase interpolator as the recovered clock signal.

8. The clock data recovery circuit of claim 7, wherein said controlled oscillator comprises a plurality of oscillator output connections that each provides a candidate recovered clock signal, and the phase interpolator is coupled to said plurality of oscillator output connections.

9. A clock data recovery circuit, comprising:
a voltage controlled oscillator that produces a first recovered clock signal and phase-shifted versions of the first recovered clock signal;
a phase interpolator that is coupled to receive the first recovered clock signal and the phase-shifted versions of the first recovered clock signal and to produce a second recovered clock signal based on the first recovered clock signal and the phase shifted versions of the first recovered clock signal; and
a feedback path
selectively coupled to receive one of the first recovered clock signal and the phase shifted versions of the first recovered clock signal and wherein, based on a comparison of a difference between a frequency of the first recovered clock signal and a frequency of a reference clock signal with a tolerance point, an output of a frequency detector is selectively conveyed to the voltage controlled oscillator at least until the frequency of the recovered clock signal differs from the frequency of the reference clock signal by at most an acceptable difference.

10. The clock data recovery circuit of claim 9, wherein the frequency detector is coupled to receive the first recovered clock signal or the second recovered clock signal from the feedback path.

11. The clock data recovery circuit of claim 9, further comprising:
a phase detector, wherein the phase detector and the frequency detector are coupled to receive the first recovered clock signal or the second recovered clock signal from the feedback path;
a charge pump; and
a switch that selects one of a first position that is non-coupling, a second position that couples an output of the frequency detector to the charge pump and a third position that couples an output of the frequency detector to the charge pump.

12. A method of operating a clock data recovery circuit, comprising:
selectively conveying by a first switch an output of a controlled oscillator as a recovered clock signal to a frequency detector and a phase detector; and
receiving, at the controlled oscillator,
based on a comparison of a difference between a frequency of the recovered clock signal and a frequency of a reference clock signal with a tolerance point, an output of the frequency detector through a second switch at least until the frequency of the recovered clock signal differs from the frequency of the reference clock signal by at most an acceptable difference.

13. The method of claim 12, wherein said controlled oscillator comprises a plurality of oscillator output connections, the method further comprising providing a candidate recovered clock signal on each of said plurality of oscillator output connections, each candidate recovered clock signal being offset in phase from every other candidate recovered clock signal.

14. The method of claim 13, wherein the first switch is coupled to the controlled oscillator by being connected to one of said plurality of oscillator output connections.

15. The method of claim 12, further comprising:
providing a data signal on a connection, wherein the phase detector is coupled to said first switch and said connection, and has a phase detector output connection; and
issuing by the phase detector phase adjustment signals on said phase detector output connection.

16. The method of claim 15, further comprising:
conveying said phase adjustment signals to the controlled oscillator; and
adjusting by the controlled oscillator the phase of the recovered clock signal according to the phase adjustment signals.

17. The method of claim 16, wherein conveying said phase adjustment signals to the controlled oscillator comprises conveying said phase adjustment signals through a charge pump and a filter.

18. The method of claim 17, alternatively conveying by the first switch an output of a phase interpolator as the recovered clock signal.

19. The method of claim 18, wherein said controlled oscillator comprises a plurality of oscillator output connections that each provides a candidate recovered clock signal, and the phase interpolator is coupled to said plurality of oscillator output connections.

* * * * *